(12) United States Patent
Makabe et al.

(10) Patent No.: US 6,607,865 B2
(45) Date of Patent: Aug. 19, 2003

(54) POSITIVE PHOTOSENSITIVE RESIN COMPOSITION

(75) Inventors: Hiroaki Makabe, Tokyo (JP); Toshio Banba, Tokyo (JP); Takashi Hirano, Tokyo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1 day.

(21) Appl. No.: 10/059,169

(22) Filed: Jan. 31, 2002

(65) Prior Publication Data

US 2002/0119389 A1 Aug. 29, 2002

(51) Int. Cl.$^7$ .............................. G03F 7/023
(52) U.S. Cl. ................ 430/191; 430/165; 430/192; 430/193; 430/286.1
(58) Field of Search ................ 430/191, 192, 430/193, 165, 286.1, 283.1

(56) References Cited

U.S. PATENT DOCUMENTS

| | | | |
|---|---|---|---|
| 5,376,499 A | * 12/1994 | Hammerschmidt et al. | 430/192 |
| 5,407,779 A | * 4/1995 | Uetani et al. | 430/192 |
| 5,747,218 A | * 5/1998 | Momota et al. | 430/192 |
| 6,071,666 A | * 6/2000 | Hirano et al. | 430/191 |
| 6,207,356 B1 | * 3/2001 | Banba et al. | 430/326 |
| 6,376,151 B1 | * 4/2002 | Takahashi et al. | 430/192 |

FOREIGN PATENT DOCUMENTS

| | | |
|---|---|---|
| JP | 1-46862 | 10/1989 |
| JP | 3-200251 | 9/1991 |
| JP | 3-200252 | 9/1991 |
| JP | 3-200253 | 9/1991 |
| JP | 3-200254 | 9/1991 |
| JP | 4-001650 | 1/1992 |
| JP | 4-011260 | 1/1992 |
| JP | 4-012356 | 1/1992 |
| JP | 4-012357 | 1/1992 |

* cited by examiner

*Primary Examiner*—John S. Chu
(74) *Attorney, Agent, or Firm*—Smith, Gambrell & Russell, LLP

(57) ABSTRACT

The present invention provides a positive photosensitive resin composition which can form a pattern of high resolution and high residual film ratio and has high sensitivity. That is, the present invention provides a positive photosensitive resin composition comprising 100 parts by weight of a polyamide resin and 1 to 50 parts by weight of a photosensitizer represented by, for example, the following formula (Q-1):

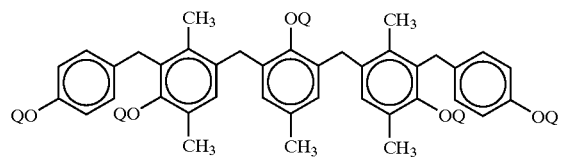

wherein each Q is hydrogen atom or

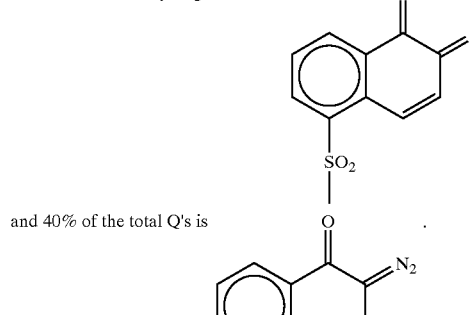

and 40% of the total Q's is

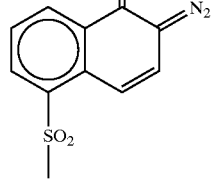

21 Claims, No Drawings

POSITIVE PHOTOSENSITIVE RESIN COMPOSITION

TECHNICAL FIELD

The present invention relates to a positive photosensitive resin composition which can form a pattern of high resolution and high residual film ratio and has high sensitivity.

BACKGROUND ART

Polyimide resins excellent in heat resistance, electrical properties, mechanical properties, etc. have heretofore been used in the surface-protecting film or interlayer dielectric of a semiconductor device. In recent years, however, significant improvements in heat cycle resistance, thermal shock resistance, etc. have become necessary for the resins used in the above applications, because semiconductor devices have come to employ a higher integration and a larger size, packages have become thinner and smaller, and the mounting has shifted to surface mounting by solder reflow. Therefore, a resin of higher performance has come to be required.

Meanwhile, a technique of allowing a polyimide resin to have photosensitivity by itself is drawing attention. The polyimide resin allowed to have photosensitivity by such a technique, includes, for example, a photosensitive polymide resin represented by the following formula (12):

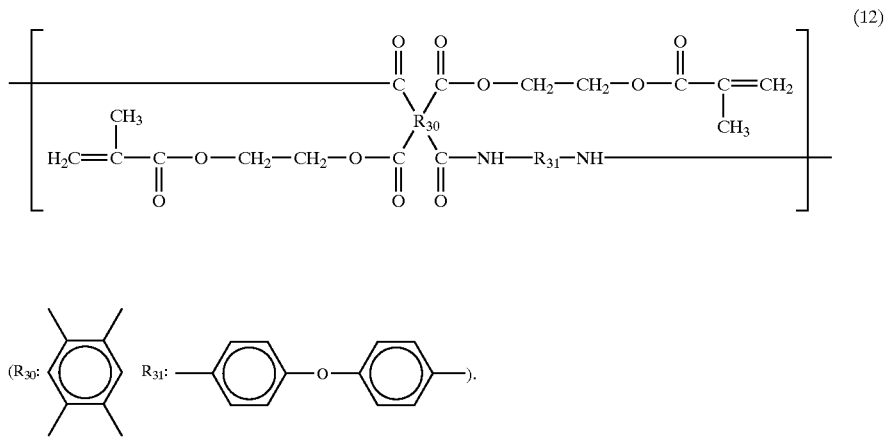

With such a resin, the step of pattern formation can be partly simplified and a shorter step and a higher yield are achieved. However, a solvent such as N-methyl-2-pyrrolidone or the like is required in the step of development, which incurs a problem in safety and handling.

Hence, there have recently been developed positive photosensitive resin compositions which can be subjected to development with an aqueous alkali solution. For example, there is disclosed, in JP-B-1-46862, a positive photosensitive resin composition constituted by a polybenzoxazole precursor, which is a base resin, and a diazoquinone compound, which is a photosensitizer. This resin composition has high heat resistance, excellent electrical properties and fine pattern formability and has a possibility of being used as a resin for wafer coating as well as for interlayer insulation. The development mechanism of this positive photosensitive resin composition is as follows. The diazoquinone compound is insoluble in an aqueous alkali solution when unexposed to a light; when exposed to a light, the diazoquinone compound gives rise to a chemical reaction to become soluble in the aqueous alkali solution; and by utilizing such difference in solubility between when exposed and when unexposed, the exposed portion is dissolved and removed, whereby a film pattern consisting of only the unexposed portion can be formed.

When these photosensitive resin compositions are used practically, particularly important is the sensitivity of each photosensitive resin composition. A low sensitivity requires a long exposure time, resulting in a low throughput. When the base resin is allowed to have a smaller molecular weight as a means for increasing the sensitivity of the photosensitive resin composition, the unexposed portion gives a large film thickness loss during development, which makes it impossible to obtain a required film thickness or incurs the collapse of pattern shape. Therefore, it is highly desired to develop a photosensitive resin composition which satisfies the above-mentioned properties and yet has high sensitivity.

DISCLOSURE OF THE INVENTION

The present invention aims at providing a positive photosensitive resin composition which can form a pattern of high resolution and high residual film ratio and has high sensitivity.

The present invention lies in a positive photosensitive resin composition comprising:

100 parts by weight of (A) a polyamide resin represented by the following general formula (1), and 1 to 50 parts by weight of (B1) a photosensitizer which is a 1,2-naphthoquinone-2-diazide-5-sulfonate or a 1,2-naphthoquinone-2-diazide-4-sulfonate, of a phenol compound having a skeletal structure represented by the following general formula (2):

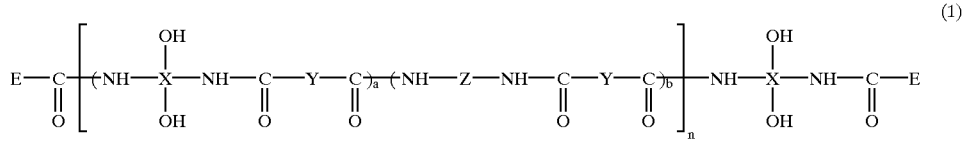

wherein X is a tetravalent cyclic compound group; Y is a divalent cyclic compound group; Z is a group represented by

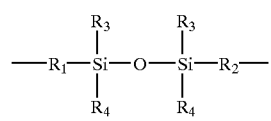

wherein $R_1$ and $R_2$ are each a divalent organic group, and $R_3$ and $R_4$ are each a monovalent organic group; E is an aliphatic group or a cyclic compound group, each having at least one alkenyl or alkynyl group; a and b each show a molar fraction, a+b=100 mole %, a=60 to 100 mole %, and b=0 to 40 mole %; and n is an average value and a positive number of 2 to 300, and

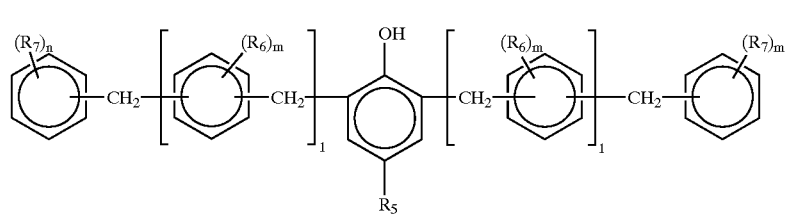

wherein $R_5$ is one atom or group selected from hydrogen atom, alkyl groups, alkoxy groups, aryl groups and substituted aryl groups; a plurality of $R_6$'s may be the same or different and are each one atom or group selected from hydrogen atom, hydroxyl group, alkyl groups, alkoxy groups, aryl groups and cycloalkyl groups, and at least one $R_6$ is hydroxyl group; a plurality of $R_7$'s may be the same or different and are each one atom or group selected from hydrogen atom, hydroxyl group, alkyl groups, alkoxy groups, aryl groups and cycloalkyl groups, and at least one $R_7$ is hydroxyl group; l is an integer of 0 to 3; m is an integer of 1 to 3; and n is an integer of 1 to 3.

DETAILED DESCRIPTION OF THE INVENTION

The polyamide resin of the general formula (1) is obtained by reacting a bis(aminophenol) having an X structure, a silicone diamine having a Z structure which is optionally used, a dicarboxylic acid or its dichloride, having a Y structure, and an acid anhydride which generates an E structure upon reaction with amino group. In order to obtain a higher yield, etc., it is possible to use a dicarboxylic acid derivative of active ester type obtained by reaction of a dicarboxylic acid with 1-hydroxy-1,2,3-benztriazole or the like. The polyamide resin, when heated at about 300 to 400° C., gives rise to dehydration and ring closure to become a polybenzoxazole which is a heat-resistant resin.

The X of the polyamide resin of the general formula (1) used in the present invention includes, for example, the followings but is not restricted thereto.

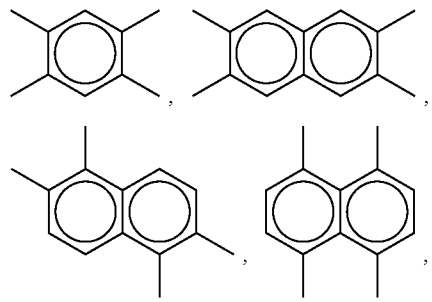

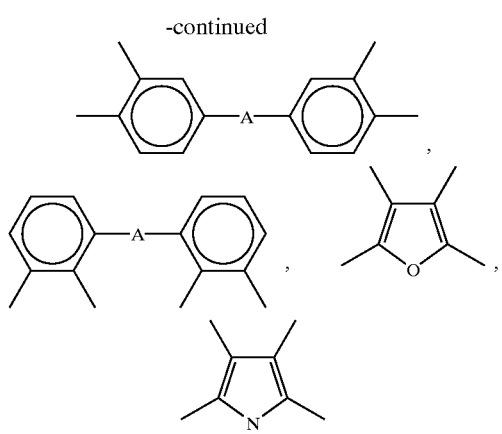

In the above, A is —$CH_2$—, —$C(CH_3)_2$—, —O—, —S—, —$SO_2$—, —CO—, —NHCO— or —$C(CF_3)_2$—.

Among them, particularly preferred one is selected from the followings.

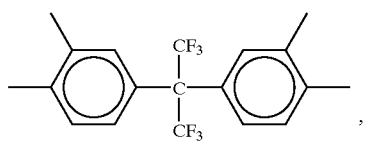

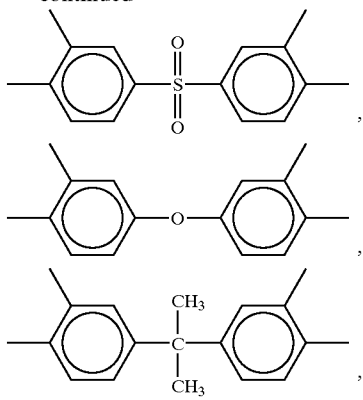

The Y of the polyamide resin of the general formula (1) includes, for example, the followings but is not restricted thereto.

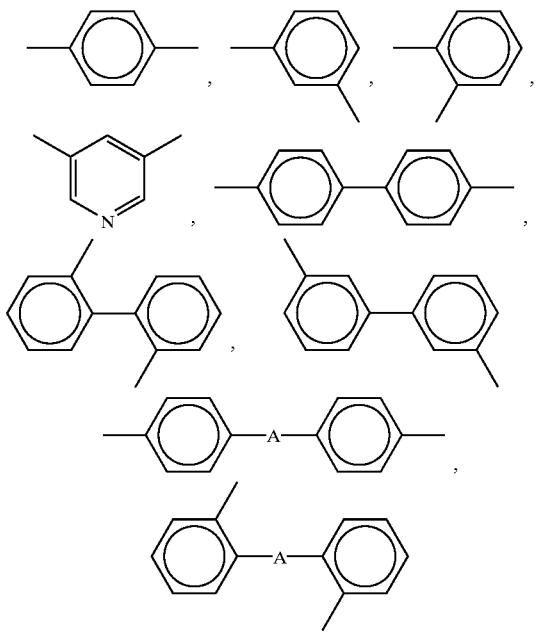

In the above, A is —CH$_2$—, —C(CH$_3$)$_2$—, —O—, —S—, —SO$_2$—, —CO—, —NHCO— or —C(CF$_3$)$_2$—.

Among them, particularly preferred one is selected from the followings.

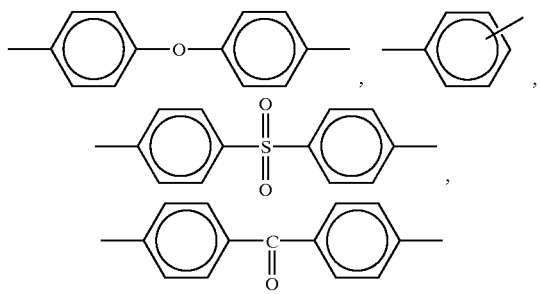

The E of the polyamide resin of the general formula (1) includes, for example, the followings but is not restricted thereto.

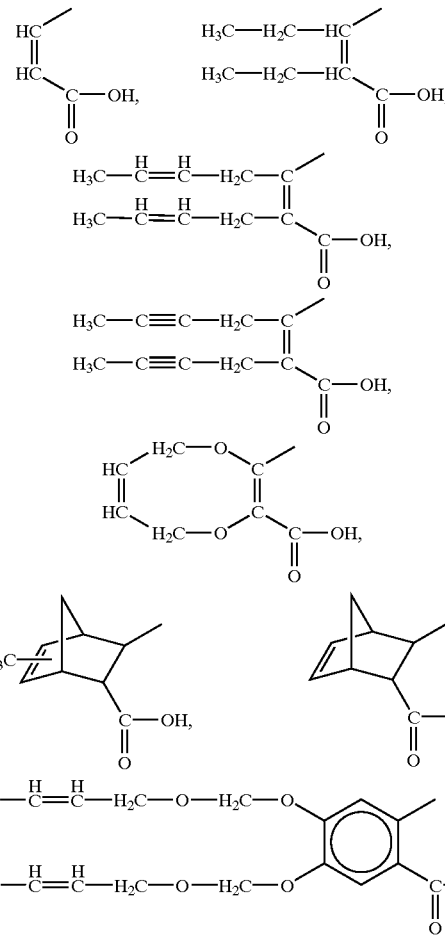

Among them, particularly preferred one is selected from the followings.

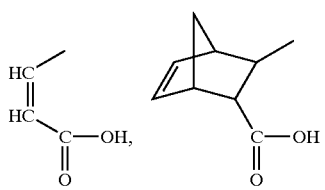

In the present invention, a dicarboxylic acid or its dichloride, or its derivative having a Y structure is reacted with a bis(aminophenol) having an X structure to synthesize a polyamide resin; thereafter, each of the terminal amino groups of the polyamide resin is capped with an acid anhydride having at least one alkenyl or alkynyl group shown in the E of the general formula (1).

The Z of the polyamide resin of the general formula (1) which is used optionally, includes, for example, the followings but is not restricted thereto.

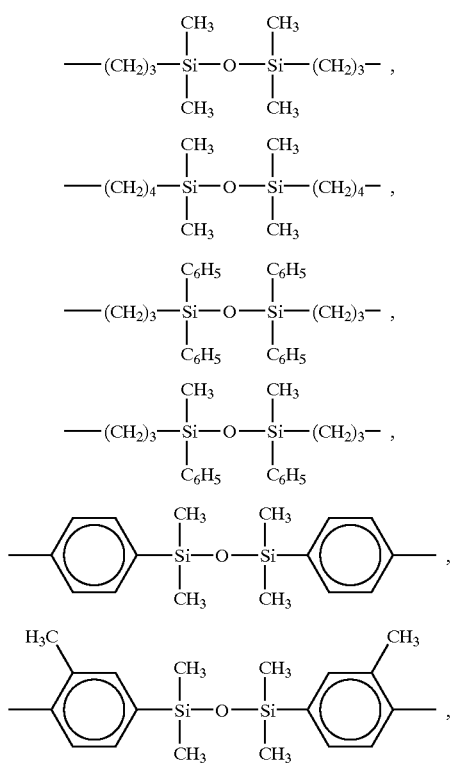

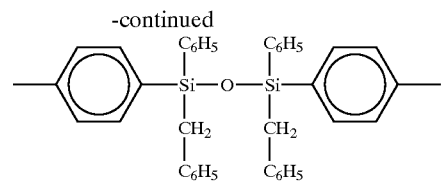

The Z of the general formula (1) is used, for example, when very high adhesion to a substrate (e.g. silicon wafer) is required. The proportion b of Z used is at most 40 mole %. A proportion of larger than 40 mole % is not preferred, because the resulting resin has very low solubility and generates scum after development, making pattern formation impossible. Each of the X, Y, E and Z may be used in one kind or admixture of two or more kinds.

The n of the general formula (1) is an average value and a positive number of 2 to 300. An n of larger than 300 is not preferred because scum may appear after development.

The examples of the phenol compound which is a skeleton of the photosensitizer (B1) used in the present invention, include the followings but are not restricted thereto.

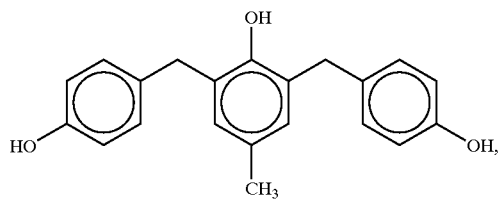

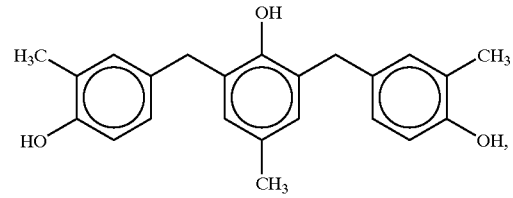

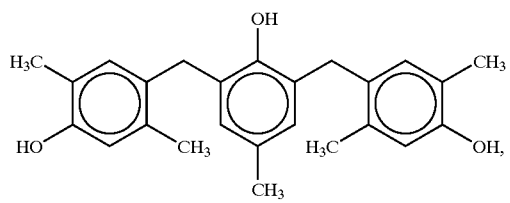

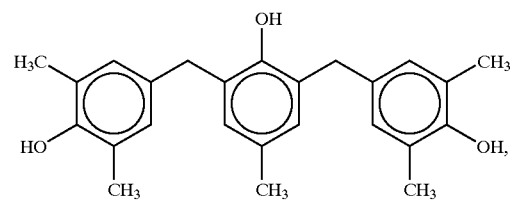

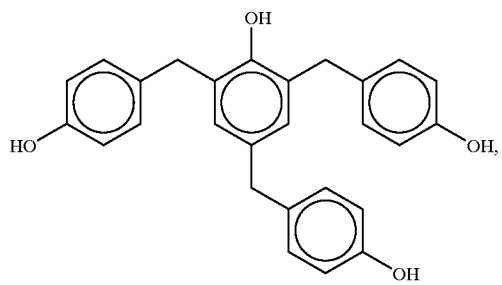

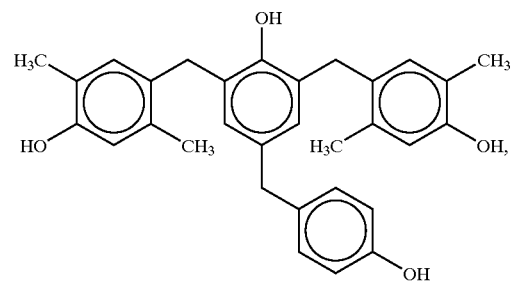

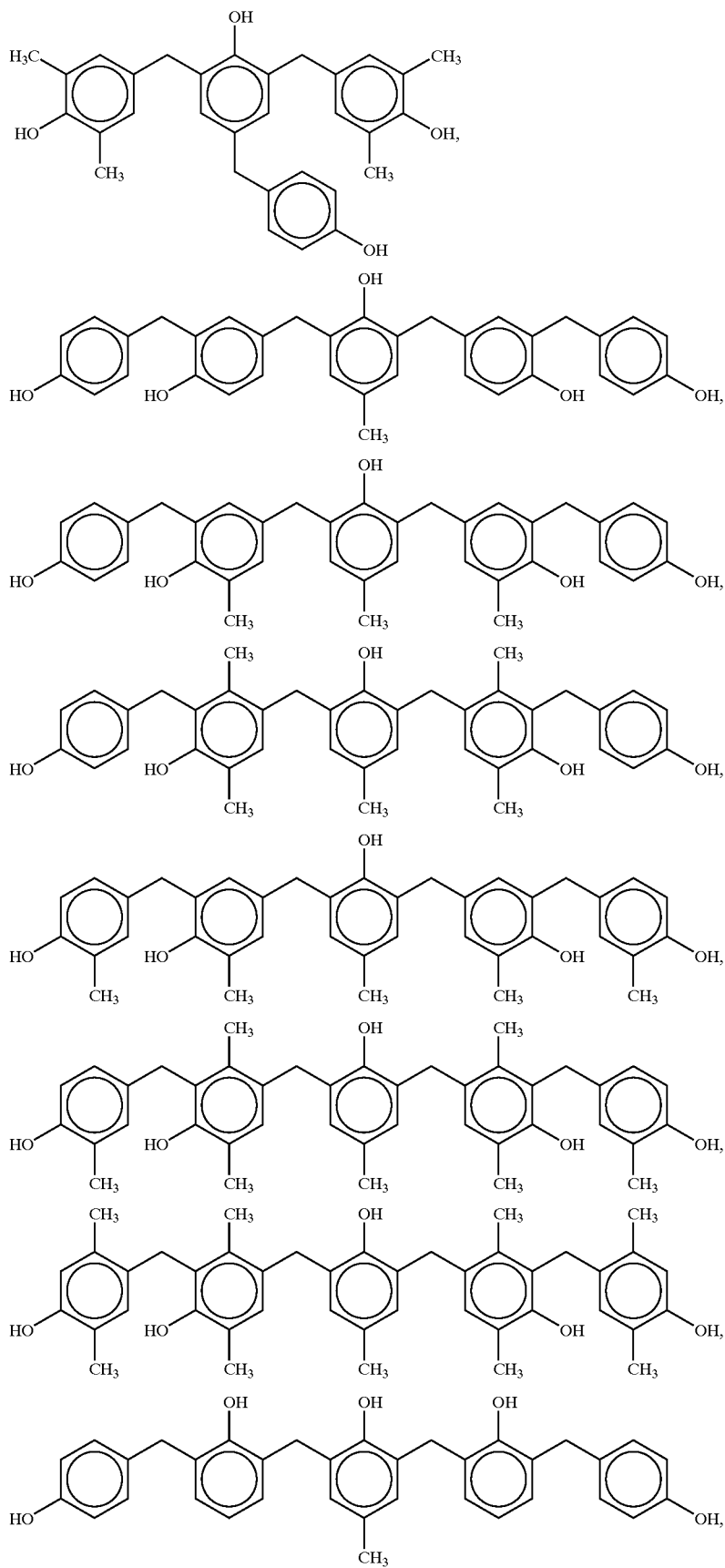

-continued

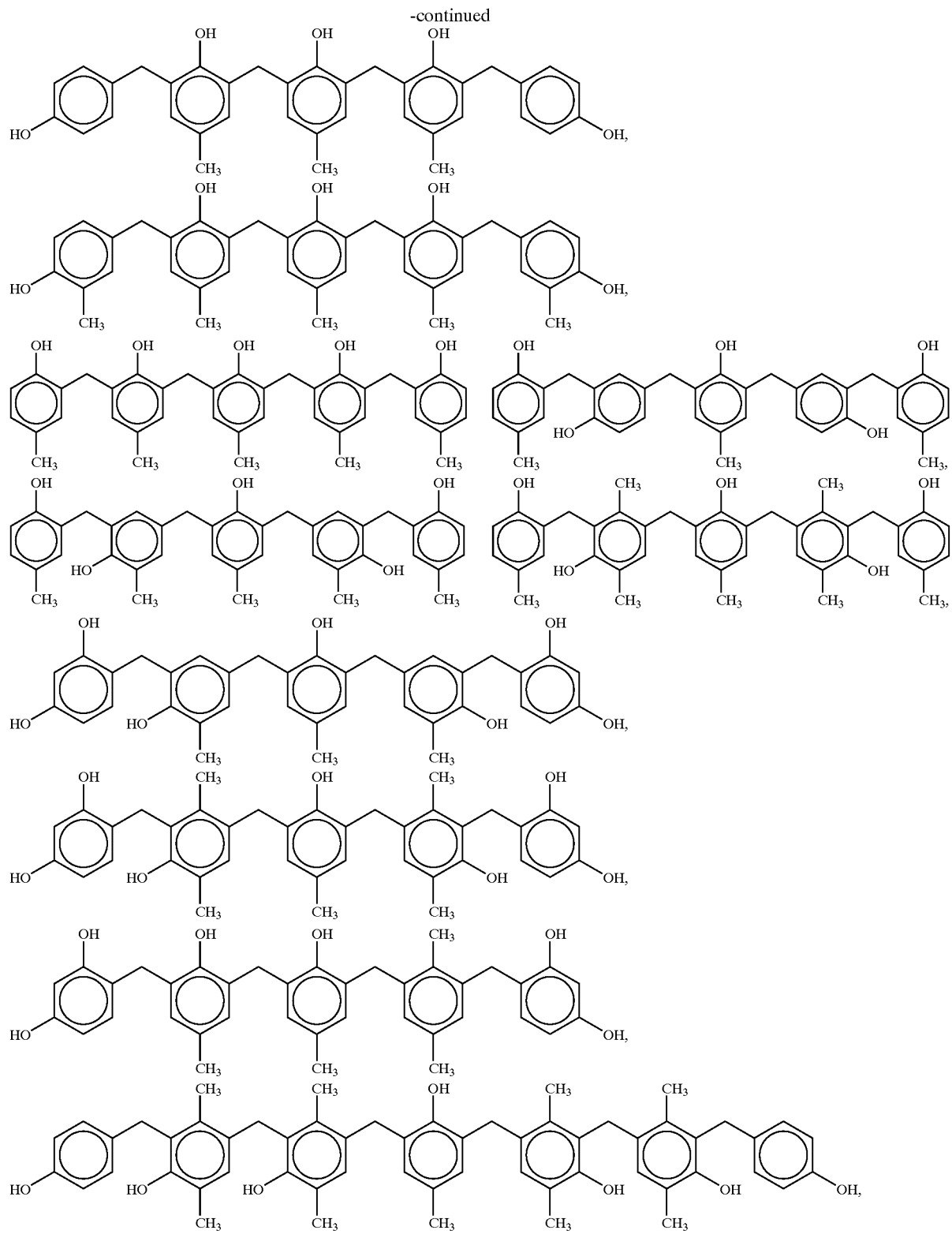

In the phenol compound of the general formula (2) constituting the photosensitizer (B1) used in the present invention, it is preferred that 20 to 80% of the hydroxyl groups is substituted into a 1,2-naphthoquinone-2-diazide-5-sulfonate or a 1,2-naphthoquinone-2-diazide-4-sulfonate. When the proportion of substitution of the hydroxyl groups is less than 20%, it is impossible to sufficiently inhibit the dissolution of the polyamide resin represented by the general formula (1) and it is impossible to obtain a desired film thickness after development. When the proportion is more than 80%, scum may generate after development at the bottom of the pattern formed. Therefore, such proportions are not preferred. Incidentally, the proportion of substitution is a proportion of substituted hydroxyl groups to the total amount of the hydroxyl groups possessed by the phenol compound represented by the general formula (2). In the present invention, the amount of the photosensitizer (B1) added to the polyamide resin (A) represented by the general formula (1) is 1 to 50 parts by weight relative to 100 parts by weight of the polyamide resin. When the amount is less than 1 part by weight, the pattern formation ability of the polyamide resin is low. When the amount is more than 50 parts by weight, the photosensitizer per se shows high absorption, resultantly the light applied does not reach the film bottom sufficiently and a significant reduction in sensitivity results. Therefore, such amounts are not preferred.

When it is intended to allow the positive photosensitive resin composition of the present invention to have an even higher sensitivity, it is important to add, to the resin composition, a photosensitizer (B2) which is a 1,2-naphthoquinone-2-diazide-5-sulfonate or a 1,2-naphthoquinone-2-diazide-4-sulfonate, of a phenol compound having a skeletal structure represented by the following general formula (4) or (5):

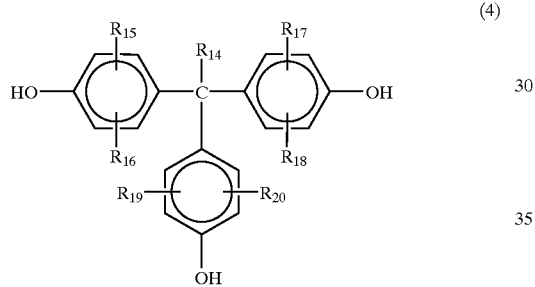

(4)

wherein $R_{14}$ is hydrogen atom or an alkyl group; and $R_{15}$, $R_{16}$, $R_{17}$, $R_{18}$, $R_{19}$ and $R_{20}$ are each one atom or group selected from hydrogen atom, halogen atoms, hydroxyl group, alkyl groups, alkoxy groups and cycloalkyl groups, or

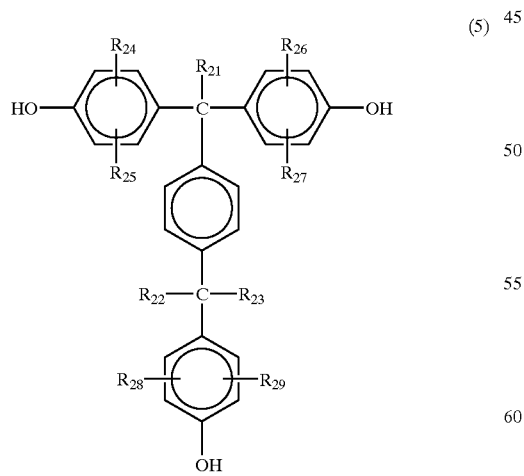

(5)

wherein $R_{21}$, $R_{22}$, $R_{23}$, $R_{24}$, $R_{25}$, $R_{26}$, $R_{27}$, $R_{28}$, and $R_{29}$ are each one atom or group selected from hydrogen atom, halogen atoms, hydroxyl group, alkyl groups, alkoxy groups and cycloalkyl groups.

Examples of the phenol compound constituting the skeleton of the photosensitizer (B2) used in the present invention include the followings but are not restricted thereto.

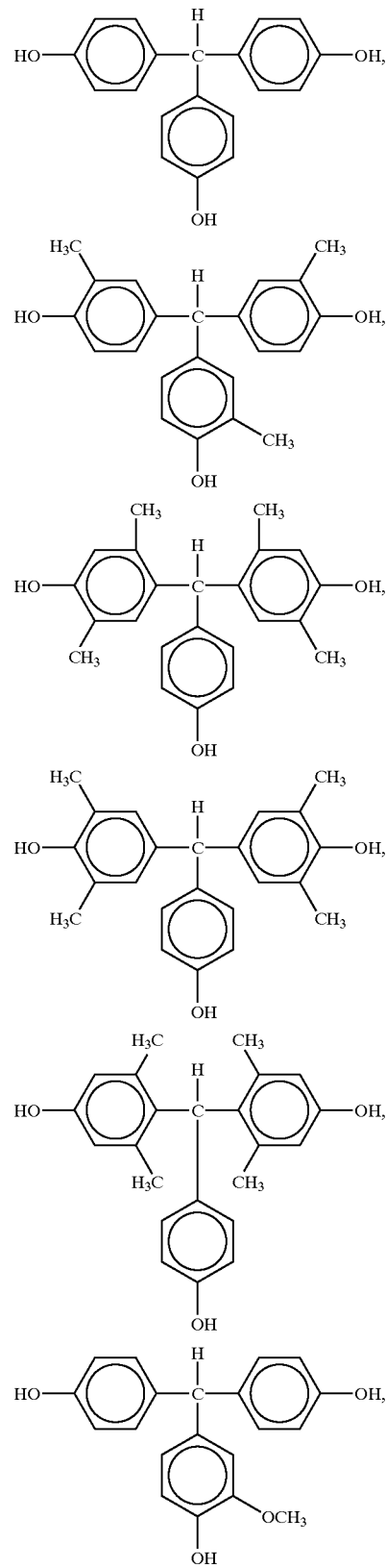

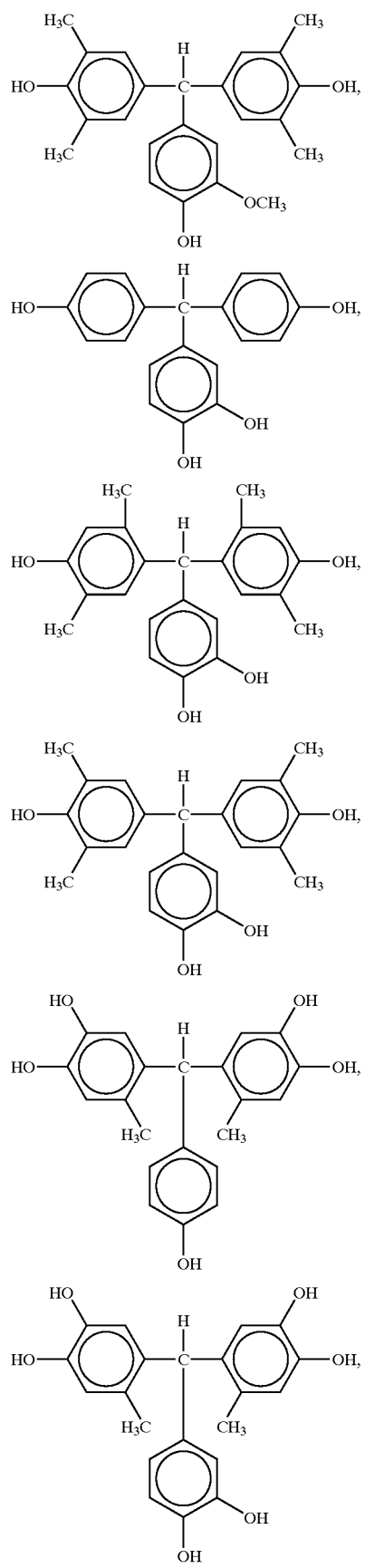
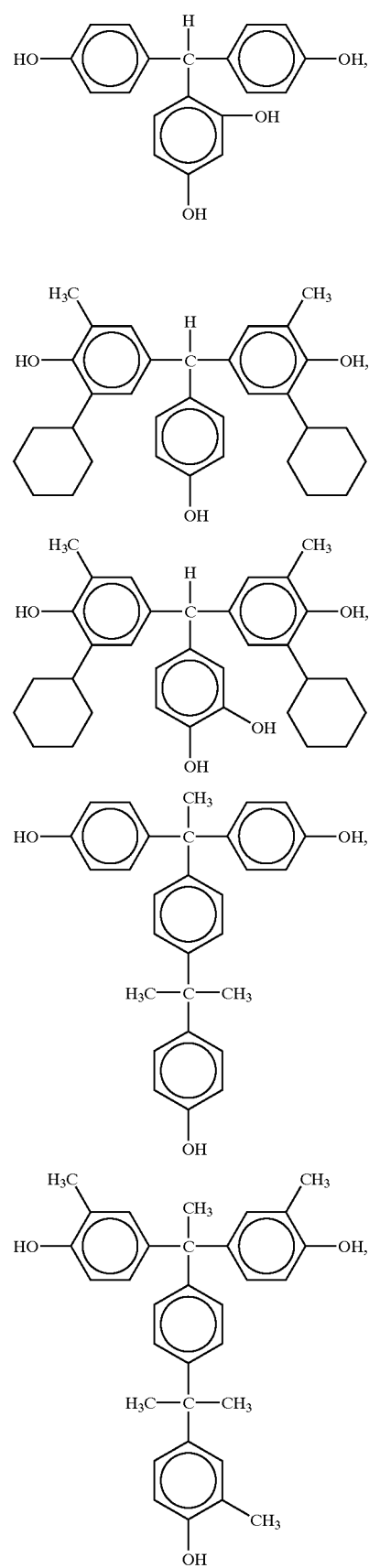

-continued

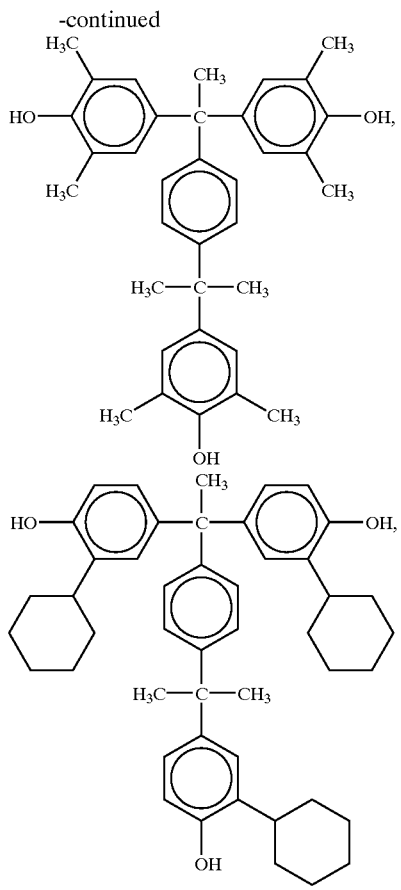

In the photosensitizer (B2) used in the present invention, it is preferred that 80 to 100% of the hydroxyl groups of the phenol compound represented by the general formula (4) or (5) is substituted into a 1,2-naphthoquinone-2-diazide-5-sulfonate or a 1,2-naphthoquinone-2-diazide-4-sulfonate. A proportion of substitution of less than 80% is not preferred because the photosensitizer (B2) may not give any clear increase in sensitivity. Incidentally, the proportion of substitution is a proportion of substituted hydroxyl groups to the total amount of the hydroxyl groups possessed by the phenol compound represented by the general formula (4) or (5). The weight ratio of the photosensitizer (B1) and the photosensitizer (B2) both used in the present invention is preferably $0.1 \leq (B2)/(B1) \leq 0.5$. When the weight ratio is less than 0.1, the photosensitizer (B2) may not give any clear increase in sensitivity. When the weight ratio is more than 0.5, scum appears at the bottom of the pattern formed by development. Therefore, such weight ratios are not preferred.

To the positive photosensitive resin composition of the present invention may be added, as necessary, a dihydropyridine derivative in order to enhance the photosensitivity of the composition. As the dihydropyridine derivative, there can be mentioned, for example, 2,6-dimethyl-3,5-diacetyl-4-(2'-nitrophenyl)-1,4-dihydropyridine, 4-(2'-nitrophenyl)-2,6-dimethyl-3,5-dicarboethoxy-1,4-dihydropyridine, and 4-(2',4'-dintrophenyl)-2,6-dimethyl-3,5-dicarbomethoxy-1,4-dihydropyridine.

In the positive photosensitive resin composition of the present invention, it is important to further use, as necessary, a phenol compound (C) represented by the following general formula (3):

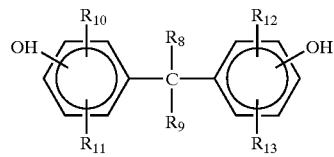

wherein $R_8$ and $R_9$ are each hydrogen atom or an alkyl group; and $R_{10}$, $R_{11}$, $R_{12}$ and $R_{13}$ are each one atom or group selected from hydrogen atom, halogen atoms, hydroxyl group, alkyl groups, alkoxy groups and cycloalkyl groups.

A technique of using a phenol compound in a positive resist composition is disclosed in, for example, JP-A-3-200251, JP-A-3-200252, JP-A-3-200253, JP-A-3-200254, JP-A-4-1650, JP-A-4-11260, JP-A-4-12356 and JP-A-4-12357. The phenol compounds mentioned in these literatures, however, show a small effect for sensitivity increase when used in the positive photosensitive resin composition of the present invention using a polyamide resin as the base resin. In contrast, when the phenol compound (c) represented by the general formula (3) is used in the present resin composition, the dissolution rate of the exposed portion is elevated, resulting in increased sensitivity; further, the film thickness loss of the unexposed portion which is seen when the molecular weight of the base resin is made small for sensitivity increase, is very small.

As the phenol compound (C) represented by the general formula (3), there can be mentioned the followings. However, the phenol compound is not restricted thereto.

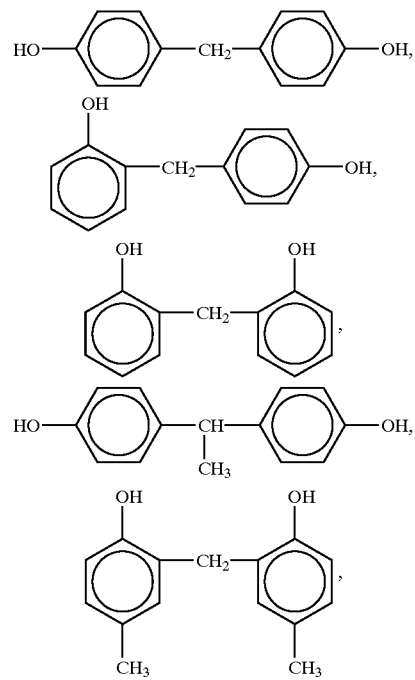

-continued
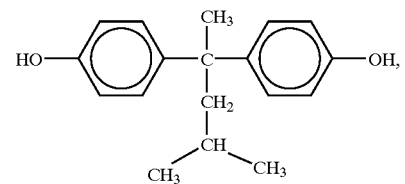
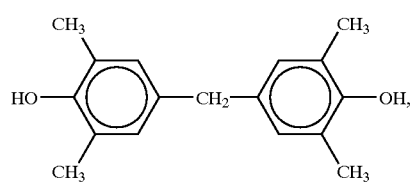
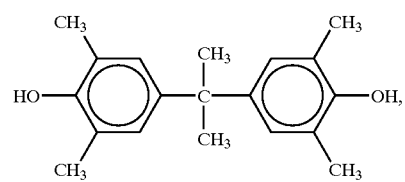
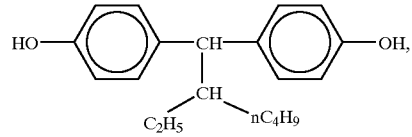
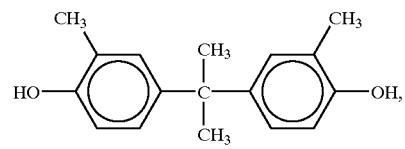
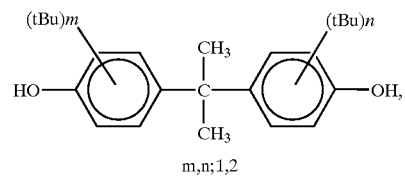
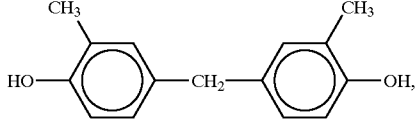
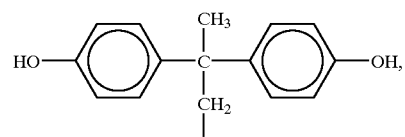
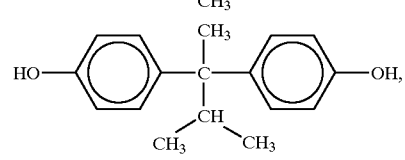
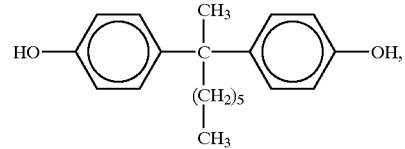
-continued
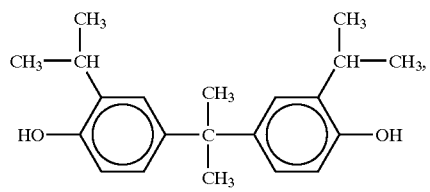
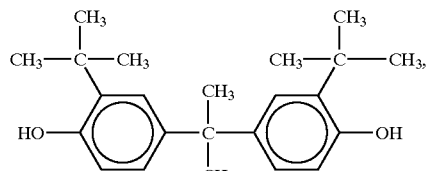
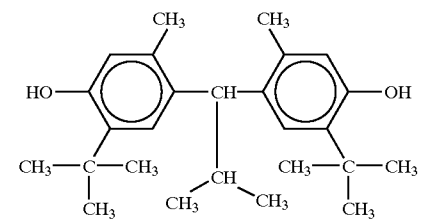
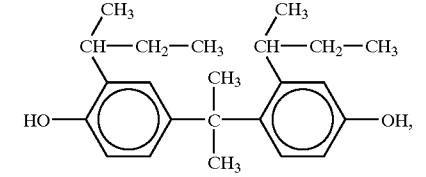
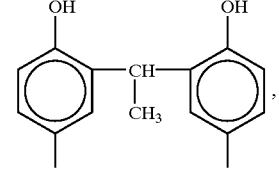
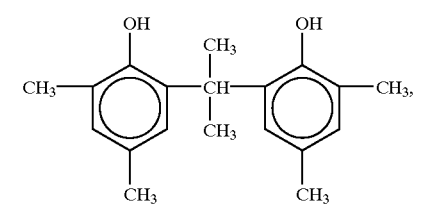
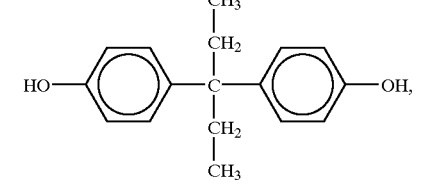
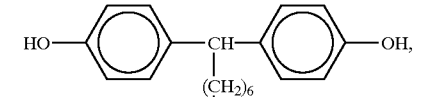
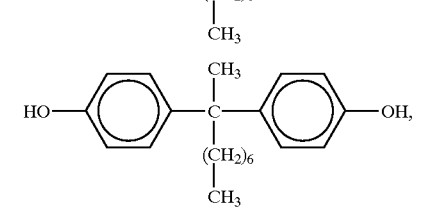

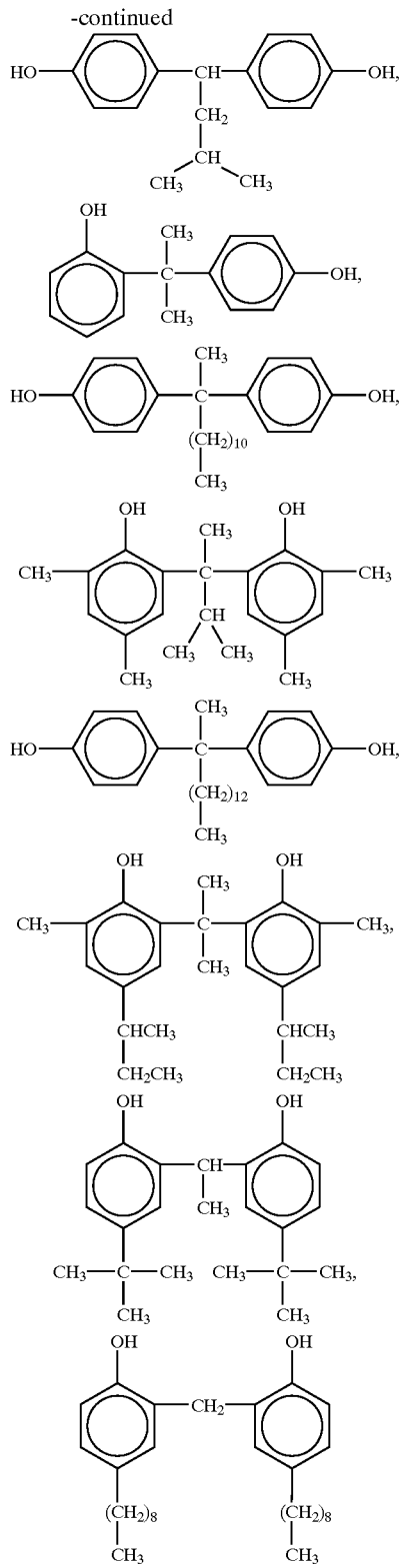

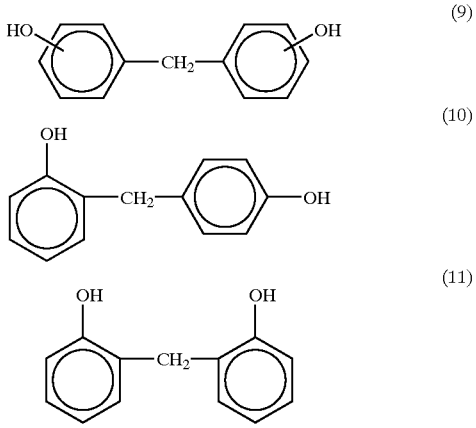

Among them, a compound of the following formula (9) is preferred, and compounds of the following formulas (10) and (11) are particularly preferred in view of the sensitivity and residual film ratio obtained therewith. It is preferred that the compound of the formula (10) and/or the compound of the formula (11) occupies 50% by weight or more of the total amount of the phenol compound (C).

The amount of the phenol compound (C) used is preferably 1 to 30 parts by weight per 100 parts by weight of the polyamide resin represented by the general formula (1). When the amount is less than 1 part by weight, the sensitivity during development is low. When the amount is more than 30 parts by weight, the residual film ratio during development is extremely low; precipitation takes place during frozen storage; accordingly, such a resin composition has no practical usability. Therefore, such amounts are not preferred.

The positive photosensitive resin composition of the present invention can contain, as necessary, additives such as levelling agent, silane coupling agent and the like.

In the present invention, the above-mentioned components are dissolved in a solvent and used in a varnish state.

As the solvent, there can be mentioned, for example, N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate and methyl 3-methoxypropionate. These solvents may be used singly or in admixture.

Description is made on the manner in which the positive photosensitive resin composition of the present invention is used. First, the composition is coated on an appropriate substrate such as silicon wafer, ceramic substrate, aluminum substrate or the like. The coating amount is such that, when used in a semiconductor device, the final film thickness after curing becomes 0.1 to 20 μm. When the film thickness is less than 0.1 μm, the film is unable to sufficiently exhibit its function as a protective surface film of a semiconductor component. When the film thickness is more than 20 μm, it is difficult to form a fine pattern. The coating is conducted by spin coating using a spinner, spray coating using a spray coater, dipping, printing, roll coating, etc.

Then, prebaking is conducted at 60 to 130° C. to dry the coated film, after which an actinic ray is applied thereto through a mask of given pattern. As the actinic ray, there can be used X-ray, electron beam, ultraviolet light, visible light, etc. A ray having a wavelength of 200 to 500 nm is preferred.

Then, the exposed portion is dissolved and removed with a developing solution to obtain a relief pattern. As the developing solution, there can be suitably used aqueous solutions of an alkali, or aqueous solutions obtained by adding thereto an appropriate amount of a water-soluble organic solvent (e.g. an alcohol such as methanol or ethanol) or a surfactant. The above alkali includes, for example, inorganic alkalis such as sodium hydroxide, potassium hydroxide, sodium carbonate, sodium silicate, sodium metasilicate, ammonia water and the like; primary amines such as ethylamine, n-propylamine and the like; secondary amines such as diethylamine, di-n-propylamine and the like; tertiary amines such as triethylamine, methyldiethylamine and the like; alcoholamines such as dimethylethanolamine, triethanolamine and the like; and quaternary ammonium salts such as tetramethylammonium hydroxide, tetraethylammonium hydroxide and the like.

The development can be conducted by spraying, paddle, dipping, ultrasonic wave, etc.

Then, the relief pattern formed by development is rinsed. Distilled water is used as the rinsing liquid. Then, a heat treatment is conducted to form an oxazole ring to obtain a highly heat-resistant final pattern.

The positive photosensitive resin composition of the present invention is useful not only for semiconductor applications but also for interlayer insulation of multi-layer circuit or surface coating of flexible copper-clad laminate or for solder resist film, liquid crystal alignment film, etc.

BEST MODE FOR CARRYING OUT THE INVENTION

The present invention is described specifically below by way of Examples.

EXAMPLE 1

Synthesis of Polyamide Resin

In a four-necked separable flask provided with a thermometer, a stirrer, a raw material inlet and a dry nitrogen gas inlet tube were placed 366.3 g (1 M) of hexafluoro-2,2-bis(3-amino-4-hydroxyphenyl)propane and 360.4 g (0.9 M) of a dicarboxylic acid derivative (an active ester) obtained by the reaction of 0.9 M of terephthalic acid and 0.1 M of isophthalic acid with 2 M of 1-hydroxy-1,2,3-benzotriazole. Thereto was added 3,000 g of N-methyl-2-pyrrolidone to obtain a solution. The solution was allowed to give rise to a reaction at 75° C. for 12 hours on an oil bath.

Then, there was added 32.8 g (0.2 M) of 5-norbornene-2,3-dicarboxylic acid anhydride dissolved in 500 g of N-methyl-2-pyrrolidone, followed by stirring for 12 hours to complete a reaction. The reaction mixture was filtered and then poured into a water/methanol (3/1) solution. The resulting precipitate was collected by filtration, washed with water thoroughly, and then dried under vacuum to obtain an intended polyamide (A-1) represented by the general formula (1) wherein X was the following formula X-1, Y was a mixture of the following formulas Y-1 and Y-2, a=100, b=0, and n=46.2.

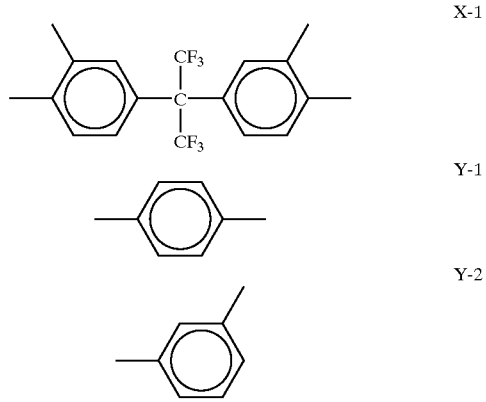

Production of Positive Photosensitive Resin Composition

In 200 g of γ-butyrolactone were dissolved 100 g of the polyamide resin (A-1) synthesized above and 24 g of a photosensitizer having the following formula (Q-1). The resulting solution was filtered through a teflon filter of 0.2 μm to obtain a positive photosensitive resin composition.

In Table 1 which appears later, the proportion of each individual component is shown as the amount (g) of the component relative to 100 g of the polyamide resin.

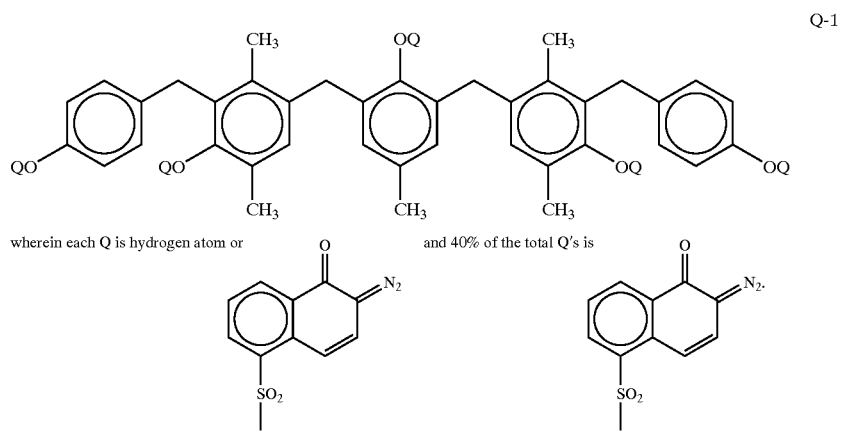

Evaluation of Properties

The positive photosensitive resin composition obtained above was coated on a silicon wafer using a spin coater and then dried on a hot plate at 120° C. for 4 minutes to obtain a film having a thickness of about 13 μm. To this film was applied a light at various exposures through a mask (Test Chart No. 1, a product of Toppan Printing Co., Ltd.) in which left patterns and removed patterns of 0.88 to 50 μm in width were drawn, using a g-line stepper (G-3A, a product of Nikon Corporation).

Then, the film was dipped in an 2.38% aqueous tetramethylammonium hydroxide solution for 110 seconds to dissolve and remove the exposed portion, followed by rinsing with pure water for 30 seconds. As a result, it was confirmed that there was pattern formation starting from the area of exposure=550 mJ/cm$^2$. (The sensitivity was 550 mJ/cm$^2$.) At that time, the residual film ratio [(film thickness after development/film thickness before development)×100] was 89.4% and the resolution was 4 μm, and they were at very good levels. There was no scum at the pattern bottom.

Separately, the positive photosensitive resin composition was coated on a silicon wafer in the same manner, prebaked, and then heated at 150° C. for 30 minutes and at 350° C. for 30 minutes in this order in a nitrogen atmosphere in an oven to obtain a cured film of a polybenzoxazole. On this cured film was molded an epoxy resin composition for semiconductor encapsulation (EME-6300H, a product of Sumitomo Bakelite Company Limited) in a size of 2 mm×2 mm×2 mm (length×width×height). The epoxy resin composition for encapsulation, molded on the cured film was measured for shear strength using a TENSILON tensile tester. The result was 3.2 kg/mm$^2$.

EXAMPLE 2

An operation and an evaluation were conducted in the same manners as in Example 1 except that the amount of the 1,2-naphthoquinone-2-diazide-5-sulfonate (Q-1) was changed as shown in Table 1.

EXAMPLE 3

An operation and an evaluation were conducted in the same manners as in Example 1 except that the 1,2-naphthoquinone-2-diazide-5-sulfonate (Q-1) was changed to (Q-2) (shown below) and the amount was also changed as shown in Table 1.

EXAMPLE 4

In the polyamide resin synthesis of Example 1, 0.9 M of terephthalic acid and 0.1 M of isophthalic acid were changed to 1 M of diphenyl ether-4,4'-dicarboxylic acid; and a reaction was conducted in the same manner as in Example 1, whereby was synthesized a polyamide resin (A-2) represented by the general formula (1) wherein X was the above-shown formula X-1, Y was the following formula Y-3, a=100, b=0, and n=27.1. An operation and an evaluation were conducted in the same manners as in Example 1 except that the polyamide resin (A-2) was used and the amount of the 1,2-naphthoquinone-2-diazide-5-sulfonate (Q-1) was changed as shown in Table 1.

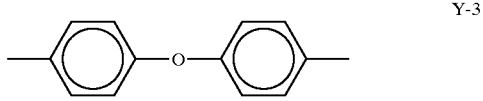

Y-3

EXAMPLE 5

In the polyamide resin synthesis of Example 1, the amount of hexafluoro-2,2-bis(3-amino-4-hydroxyphenyl) propane was decreased to 348.0 g (0.95 M) and 12.4 g (0.05 M) of 1,3-bis(3-aminopropyl)-1,1,3,3-tetramethyldisiloxane was added, whereby was synthesized a polyamide resin (A-3) represented by the general formula (1) wherein X was the above-shown formula X-1, Y was a mixture of the above-shown formulas Y-1 and Y-2, Z was the following formula Z-1, a=95, b=5, and n=33.0. An operation and an evaluation were conducted in the same manners as in Example 1 except that the polyamide resin (A-3) was used and the amount of the 1,2-naphthoquinone-2-diazide-5-sulfonate (Q-1) was changed as shown in Table

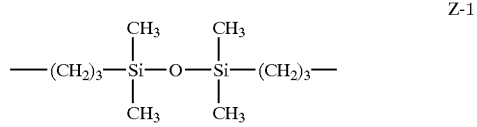

Z-1

EXAMPLE 6

In 200 g of γ-butyrolactone were dissolved 100 g of the polyamide resin (A-2) synthesized in Example 4, 20 g of the

Q-2

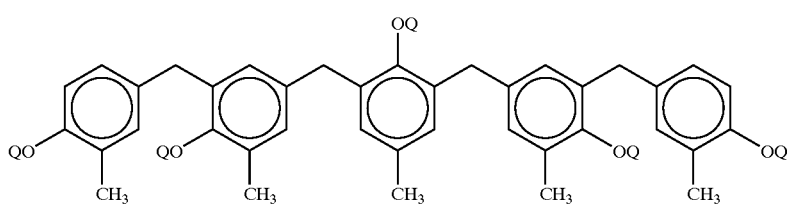

wherein each Q is hydrogen atom or 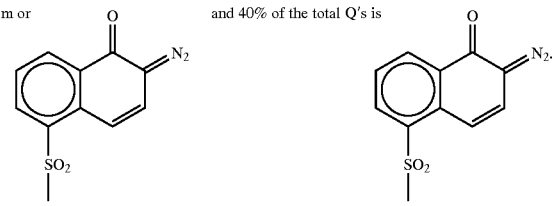 and 40% of the total Q's is photosensitizer of the formula (Q-1) and 10 g of a phenol compound of the following formula (P-1). The resulting solution was filtered through a teflon filter of 0.2 µm to obtain a positive photosensitive resin composition. The subsequent operation and evaluation were conducted in the same manners as in Example 1.

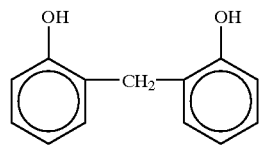

P-1

EXAMPLE 7

An operation and an evaluation were conducted in the same manners as in Example 6 except that the amount of the 1,2-naphthoquinone-2-diazide-5-sulfonate (Q-1) was changed as shown in Table 1 and the phenol compound (P-1) was changed to the following phenol compound (P-2).

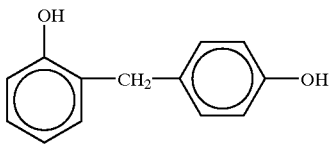

P-2

EXAMPLE 8

In 200 g of γ-butyrolactone were dissolved 100 g of the polyamide resin (A-2) synthesized in Example 4, 16 g of the photosensitizer of the formula (Q-1), 4 g of a photosensitizer of the following formula (Q-3) and 10 g of the phenol compound of the formula (P-1). The resulting solution was filtered through a teflon filter of 0.2 µm to obtain a positive photosensitive resin composition. The subsequent operation and evaluation were conducted in the same manners as in Example 1.

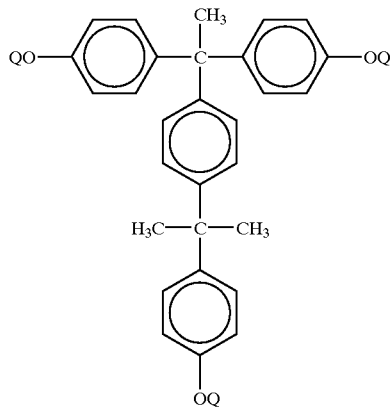

Q-3 wherein each Q is hydrogen atom or

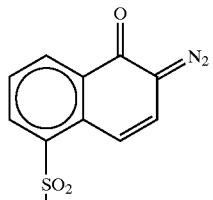

and 100% of the total Q's is

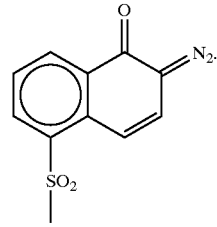

EXAMPLE 9

An operation and an evaluation were conducted in the same manners as in Example 8 except that the 1,2-naphthoquinone-2-diazide-5-sulfonate (Q-1) was changed to (Q-2), (Q-3) was changed to the following (Q-4) and the amounts of the individual components were changed as shown in Table 1.

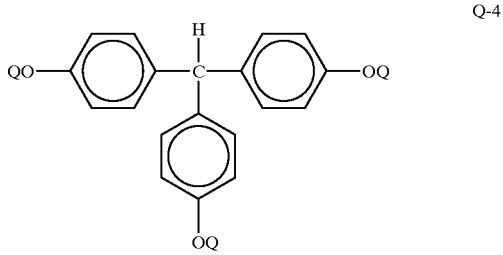

Q-4 wherein each Q is hydrogen atom or

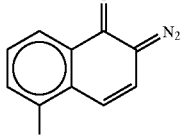

and 90% of the total Q's is

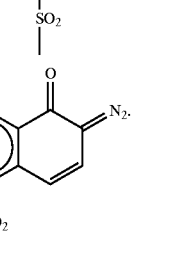

EXAMPLE 10

An operation and an evaluation were conducted in the same manners as in Example 8 except that the phenol compound (P-1) was changed to (P-2) and the amounts of the individual components were changed as shown in Table 1.

Comparative Examples 1 to 10

Positive photosensitive resin compositions were produced in the formulations shown in Table 1, in the same manner as in Example 1, and were evaluated in the same manner as in Example 1. Incidentally, the polyamide resin used in each of Comparative Examples 1 to 10 was (A-2).

The structures of the Q-5 to Q-9 used in Comparative Examples are shown below.

Q-5

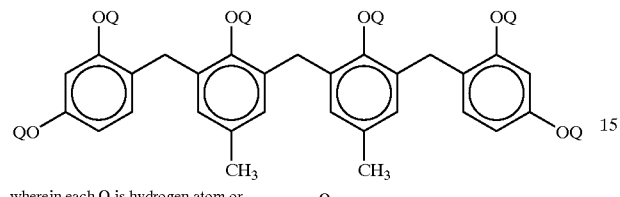

wherein each Q is hydrogen atom or

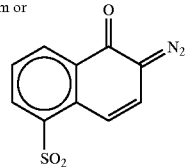

and 50% of the total Q's is

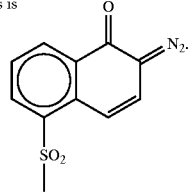

Q-6

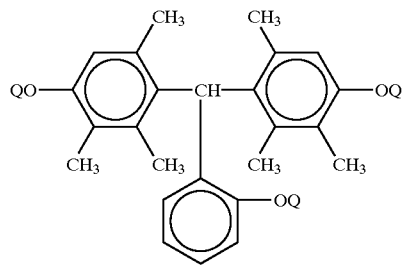

wherein each Q is hydrogen atom or

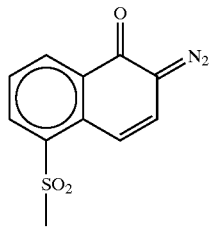

and 67% of the total Q's is

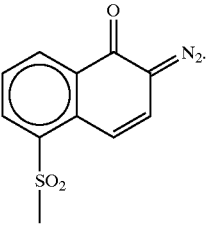

Q-7

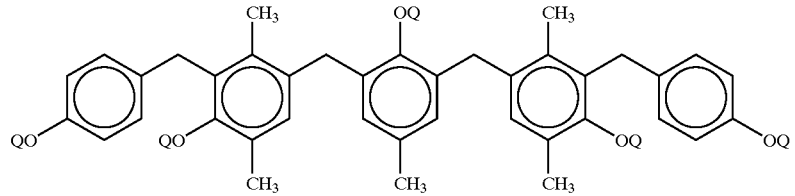

wherein each Q is hydrogen atom or

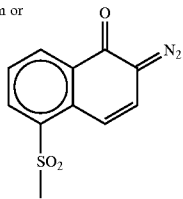

and 5% of the total Q's is

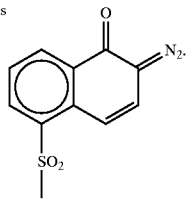

Q-8

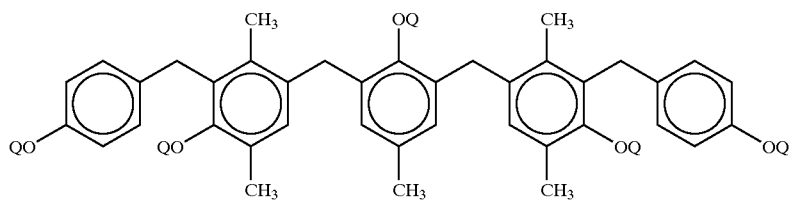

wherein each Q is hydrogen atom or 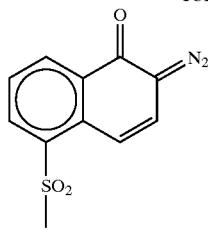 and 98% of the total Q's is 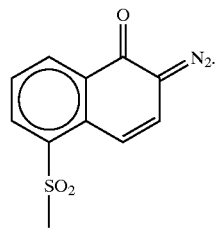

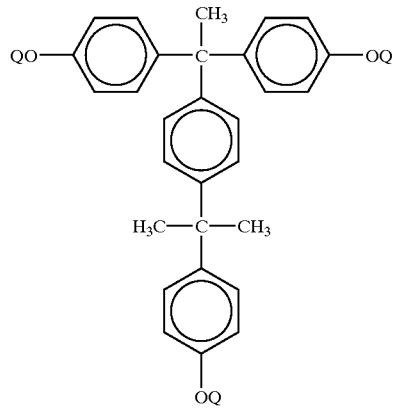 Q-9 wherein each Q is hydrogen atom or and 60% of the total Q's is

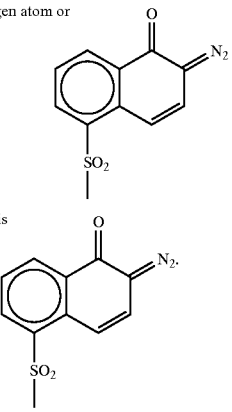

TABLE 1

| | Formulation | | | | | Properties | | | | |
|---|---|---|---|---|---|---|---|---|---|---|
| | Polyamide resin (A) (100 g) | | Photosensitizer | | Phenol compound | Sensitivity | Residual film | Resolution | | Shear strength |
| | Amine | Acid | (B-1) (g) | (B-2) (g) | (C) (g) | (mJ/cm²) | ratio (%) | (μm) | Scum | (kg/mm²) |
| Example 1 | X-1 | Y-1, Y-2 | Q-1 24 | — | — | 550 | 89.4 | 4 | None | 3.2 |
| Example 2 | X-1 | Y-1, Y-2 | Q-1 19 | — | — | 390 | 77.5 | 3 | None | 3.4 |
| Example 3 | X-1 | Y-1, Y-2 | Q-2 22 | — | — | 470 | 82.0 | 4 | None | 3.0 |
| Example 4 | X-1 | Y-3 | Q-1 20 | — | — | 440 | 79.2 | 3 | None | 3.5 |
| Example 5 | X-1, Z-1 | Y-1, Y-2 | Q-1 20 | — | — | 480 | 82.6 | 5 | None | 4.0 |
| Example 6 | X-1 | Y-3 | Q-1 20 | — | P-1 10 | 390 | 80.2 | 3 | None | 3.6 |
| Example 7 | X-1 | Y-3 | Q-1 22 | — | P-2 10 | 420 | 84.2 | 4 | None | 3.3 |
| Example 8 | X-1 | Y-3 | Q-1 16 | Q-3 4 | P-1 10 | 360 | 80.4 | 3 | None | 3.5 |
| Example 9 | X-1 | Y-3 | Q-2 14.3 | Q-4 4.7 | P-1 10 | 440 | 82.4 | 3 | None | 3.4 |
| Example 10 | X-1 | Y-3 | Q-1 15 | Q-3 5 | P-2 15 | 370 | 81.6 | 3 | None | 3.3 |
| Comp. Example 1 | X-1 | Y-3 | Q-5 19 | — | — | 540 | 81.9 | >50 | Present | 3.3 |
| Comp. Example 2 | X-1 | Y-3 | Q-1 55 | — | — | >800 | 99.7 | No hole formation | Impossible to examine | 2.6 |
| Comp. Example 3 | X-1 | Y-3 | Q-2 0.5 | — | — | — | 0 | — | Impossible to examine | 3.6 |
| Comp. Exanple 4 | X-1 | Y-3 | Q-5 16 | Q-3 4 | — | 510 | 84.8 | >50 | Present | 3.2 |
| Comp. Example 5 | X-1 | Y-3 | Q-6 14.3 | Q-3 4.7 | P-1 10 | 390 | 68.2 | >50 | Present | 3.4 |
| Comp. Example 6 | X-1 | Y-3 | Q-7 17 | Q-3 8 | P-1 10 | 520 | 70.5 | 10 | None | 3.5 |
| Comp. Example 7 | X-1 | Y-3 | Q-8 15 | Q-3 5 | P-2 15 | 570 | 91.7 | >50 | Present | 3.2 |
| Comp. Example 8 | X-1 | Y-3 | Q-1 16 | Q-9 5 | P-1 10 | 460 | 82.6 | 5 | None | 3.5 |
| Comp. Example 9 | X-1 | Y-3 | Q-1 15 | Q-3 1 | P-1 10 | 360 | 74.4 | 4 | None | 3.4 |
| Comp. Example 10 | X-1 | Y-3 | Q-1 13 | Q-3 8 | P-1 10 | 440 | 86.9 | >50 | Present | 3.3 |

As appreciated from the above, the present invention can provide a positive photosensitive resin composition which can form a pattern of high resolution and high residual film ratio and has high sensitivity.

What is claimed is:

1. A positive photosensitive resin composition comprising:

100 parts by weight of (A) a polyamide resin represented by the following general formula (1), and 1 to 50 parts by weight of (B1) a photosensitizer which is a 1,2-naphthoquinone-2-diazide-5-sulfonate or a 1,2-naphthoquinone-2-diazide-4-sulfonate, of a phenol compound having a skeletal structure represented by the following general formula (2):

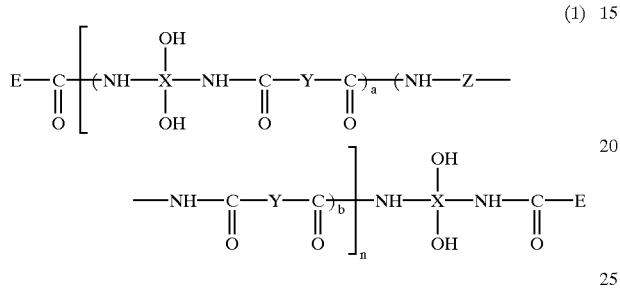

(1)

wherein X is a tetravalent cyclic compound group; Y is a divalent cyclic compound group; Z is a group represented by

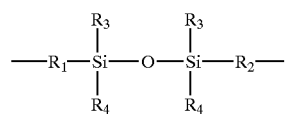

wherein $R_1$ and $R_2$ are each a divalent organic group, and $R_3$ and $R_4$ are each a monovalent organic group; E is an aliphatic group or a cyclic compound group, each having at least one alkenyl or alkynyl group; a and b each show a molar fraction, a+b=100 mole %, a=60 to 100 mole %, and b=0 to 40 mole %; and n is an average value and a positive number of 2 to 300, and

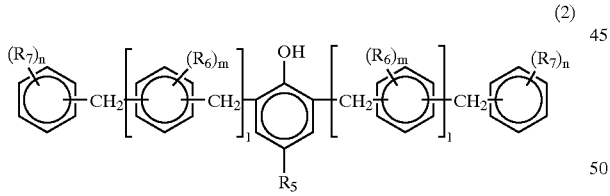

(2)

wherein $R_5$ is one atom or group selected from hydrogen atom, alkyl groups, alkoxy groups, aryl groups and substituted aryl groups; a plurality of $R_6$'s may be the same or different and are each one atom or group selected from hydrogen atom, hydroxyl group, alkyl groups, alkoxy groups, aryl groups and cycloalkyl groups, and at least one $R_6$ is hydroxyl group; a plurality of $R_7$'s may be the same or different and are each one atom or group selected from hydrogen atom, hydroxyl group, alkyl groups, alkoxy groups, aryl groups and cycloalkyl groups, and at least one $R_7$ is hydroxyl group; l is an integer of 0 to 3; m is an integer of 1 to 3; and n is an integer of 1 to 3.

2. A positive photosensitive resin composition according to claim 1, wherein 20 to 80% of the hydroxyl groups of the phenol compound having a skeletal structure represented by the general formula (2) is substituted into a 1,2-naphthoquinone-2-diazide-5-sulfonate or a 1,2-naphthoquinone-2-diazide-4-sulfonate.

3. A positive photosensitive resin composition according to claim 1, wherein the X of the polyamide resin represented by the general formula (1) is selected from a group of the following formulas (6).

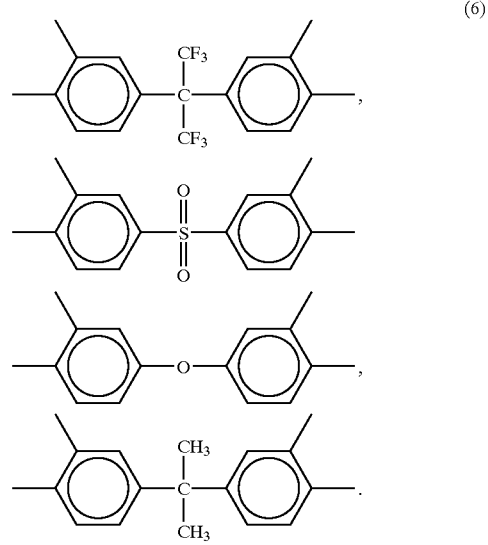

(6)

4. A positive photosensitive resin composition according to claim 1, wherein the Y of the polyamide resin represented by the general formula (1) is selected from a group of the following formulas (7).

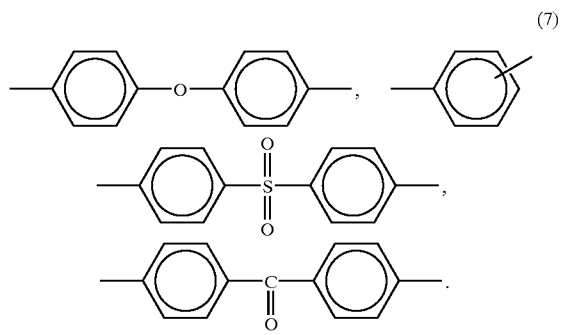

(7)

5. A positive photosensitive resin composition according to claim 1, wherein the E of the polyamide resin represented by the general formula (1) is selected from a group of the following formulas (8).

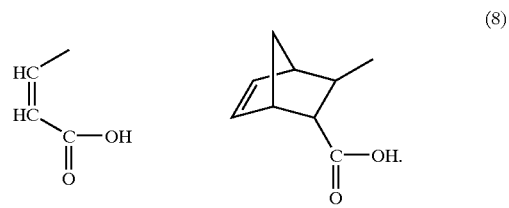

(8)

6. A positive photosensitive resin composition comprising:

100 parts by weight of (A) a polyamide resin represented by the general formula (1),

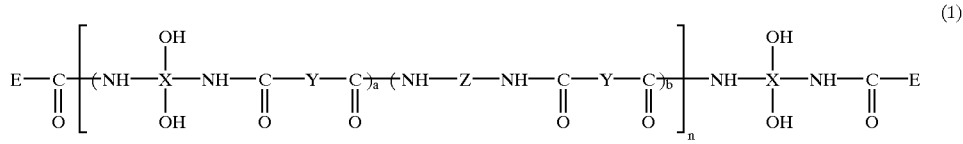

wherein X is a tetravalent cyclic compound group; Y is a divalent cyclic compound group; Z is a group represented by

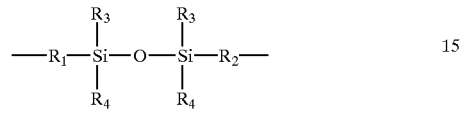

wherein $R_1$ and $R_2$ are each a divalent organic group, and $R_3$ and $R_4$ are each a monovalent organic group; E is an aliphatic group or a cyclic compound group, each having at least one alkenyl or alkynyl group; a and b each show a molar fraction, a+b=100 mole %, a=60 to 100 mole %, and b=0 to 40 mole %; and n is an average value and a positive number of 2 to 300, 1 to 50 parts by weight of (B1) a photosensitizer which is a 1,2-naphthoquinone-2-diazide-5-sulfonate or a 1,2-naphthoquinone-2-diazide-4-sulfonate, of a phenol compound havinq a skeletal structure represented by the general formula (2),

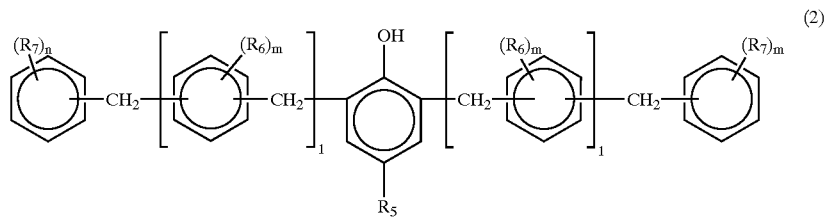

wherein $R_5$ is one atom or group selected from hydrogen atom, alkyl groups, alkoxy groups, aryl groups and substituted aryl groups; a plurality of $R_6$'s may be the same or different and are each one atom or group selected from hydrogen atom, hydroxyl group, alkyl groups, alkoxy groups, aryl groups and cycloalkyl groups, and at least one $R_6$ is hydroxyl group; a plurality of $R_7$'s may be the same or different and are each one atom or group selected from hydrogen atom, hydroxyl group, alkyl groups, alkoxy groups, aryl groups and cycloalkyl groups, and at least one $R_7$ is hydroxyl group; l is an integer of 0 to 3; m is an integer of 1 to 3; and n is an integer of 1 to 3, and 1 to 30 parts by weight of (C) a phenol compound represented by the following general formula (3):

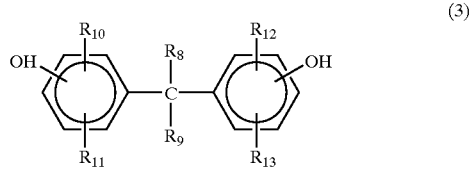

wherein $R_8$ and $R_9$ are each hydrogen atom or an alkyl group; and $R_{10}$, $R_{11}$, $R_{12}$ and $R_{13}$ are each one atom or group selected from hydrogen atom, halogen atoms, hydroxyl group, alkyl groups, alkoxy groups and cycloalkyl groups.

7. A positive photosensitive resin composition according to claim 6, wherein 20 to 80% of the hydroxyl groups of the phenol compound having a skeletal structure represented by the general formula (2) is substituted into a 1,2- naphthoquinone-2-diazide-5-sulfonate or a 1,2-naphthoquinone-2-diazide-4-sulfonate.

8. A positive photosensitive resin composition according to claim 6, wherein the X of the polyamide resin represented by the general formula (1) is selected from a group of the formulas (6)

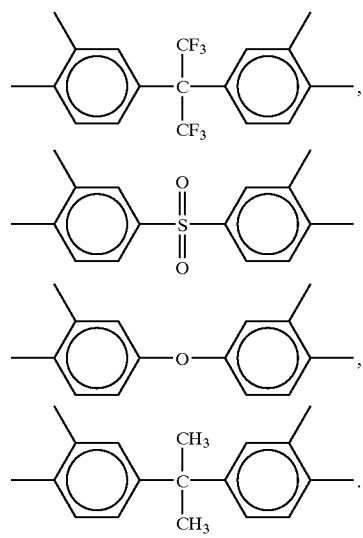

9. A positive photosensitive resin composition according to claim 6, wherein the Y of the polyamide resin represented by the general formula (1) is selected from a group of the formulas (7)

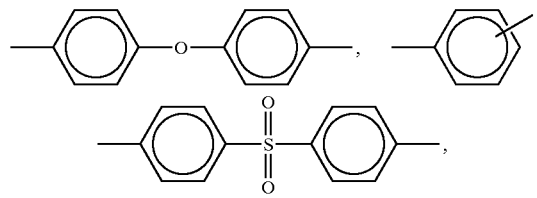

-continued

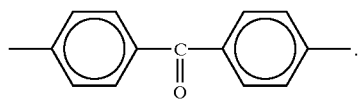

10. A positive photosensitive resin composition according to claim 6, wherein the E of the polyamide resin represented by the general formula (1) is selected from a group of the formulas (8)

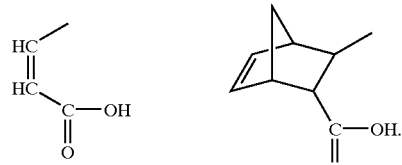

11. A positive photosensitive resin composition according to claim 6, wherein the phenol compound (C) is a phenol compound represented by the following formula (9).

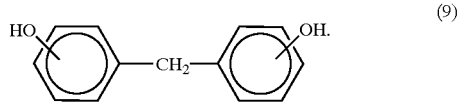

12. A positive photosensitive resin composition according to claim 6, wherein the total phenol compounds contain a phenol compound represented by the following formula (10) and/or a phenol compound represented by the following formula (11) in an amount of 50% by weight or more.

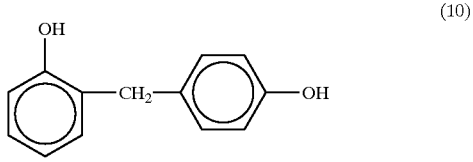

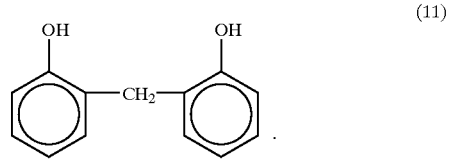

13. A positive photosensitive resin composition comprising:

100 parts by weight of (A) a polyamide resin represented by the general formula (1),

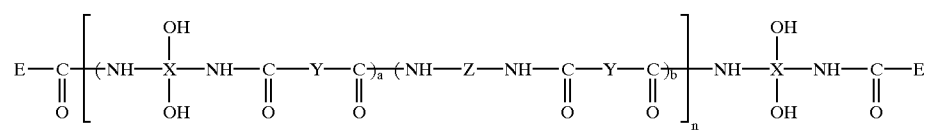

wherein X is a tetravalent cyclic compound group; Y is a divalent cyclic compound group; Z is a group represented by

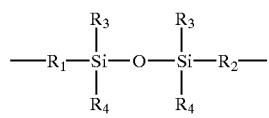

wherein $R_1$ and $R_2$ are each a divalent organic group, and $R_3$ and $R_4$ are each a monovalent organic group; E is an aliphatic group a cyclic compound group, each having at least one alkenyl or alknyl group; a and b each show a molar fraction, a+b=100 mole %, a=60 to 100 mole %, and b=0 to 40 mole %; and n is an average value and a positive number of 2 to 300, 1 to 50 parts by weight of (B1) a photosensitizer which is a 1,2-naphthoquinone-2-diazide-5-sulfonate or a 1,2-naphthoquinone-2-diazide-4-sulfonate, of a phenol compound having a skeletal structure represented by the general formula (2),

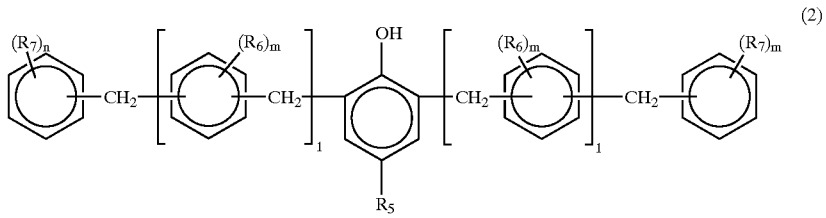

(2)

wherein $R_5$ is one atom or group selected from hydrogen atom, alkyl groups, alkoxy groups, aryl groups and substituted aryl groups; a plurality of $R_6$'s may be the same or different and are each one atom or group selected from hydrogen atom, hydroxyl group, alky groups, alkoxy groups, aryl groups and cycloalkyl groups, and at least one $R_6$ is hydroxyl group; a plurality of $R_7$'s may be the same or different and are each one atom or group selected from hydrogen atom, hydroxyl group, alkyl groups, alkoxy groups, aryl groups and cycloalkyl groups, and at least one $R_7$ is hydroxyl group; l is an integer of 0 to 3; m is an integer of 1 to 3; and n is an integer of 1 to 3, 0.1 to 25 parts by weight of (B2) a photosensitizer which is a 1,2-naphthoquinone-2-diazide-5-sulfonate or a 1,2-naphthoquinone-2-diazide-4-sulfonate, of a phenol compound having a skeletal structure represented by the following general formula (4) or (5),

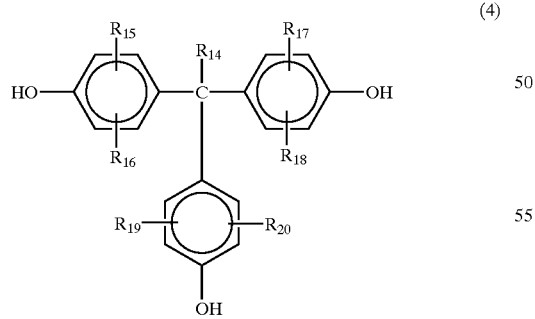

(4)

wherein $R_{14}$ is hydrogen atom or an alkyl group; and $R_{15}$, $R_{16}$, $R_{17}$, $R_{18}$, $R_{19}$ and $R_{20}$ are each one atom or group selected from hydrogen atom, halogen atoms, hydroxyl group, alkyl groups, alkoxy groups and cycloalkyl groups, or

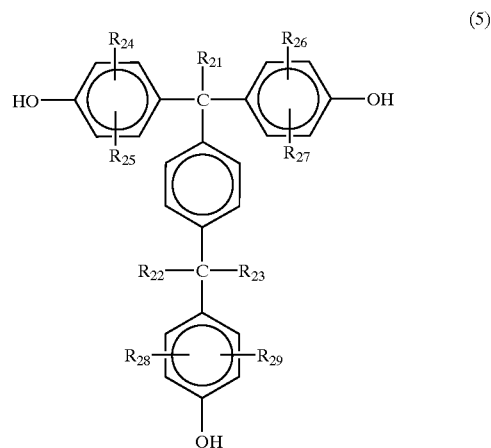

(5)

wherein $R_{21}$, $R_{22}$, $R_{23}$, $R_{24}$, $R_{25}$, $R_{26}$, $R_{27}$, $R_{28}$ and $R_{29}$ are each one atom or group selected from hydrogen atom, halogen atoms, hydroxyl group, alkyl groups, alkoxy groups and cycloalkyl groups, and 1 to 30 parts by weight of (C) a phenol compound represented by the following general formula (3):

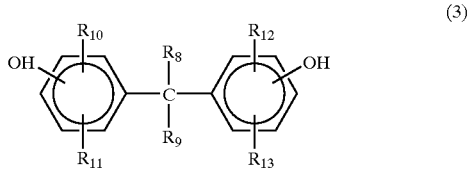

(3)

wherein $R_8$ and $R_9$ are each hydrogen atom or an alkyl group; and $R_{10}$, $R_{11}$, $R_{12}$ and $R_{13}$ are each one atom or group selected from hydrogen atom, halogen atoms, hydroxyl group, alkyl groups, alkoxy groups and cyloalkyl groups.

14. A positive photosensitive resin composition according to claim 13, wherein 20 to 80% of the hydroxyl groups of the phenol compound having a skeletal structure represented by the general formula (2) is substituted into a 1,2-naphthoquinone-2-diazide-5-sulfonate or a 1,2-naphthoquinone-2-diazide-4-sulfonate.

15. A positive photosensitive resin composition according to claim 13, wherein 80 to 100% of the hydroxyl groups of the phenol compound having a skeletal structure represented by the general formula (4) or (5) is substituted into a 1,2-naphthoquinone-2-diazide-5-sulfonate or a 1,2-naphthoquinone-2-diazide-4-sulfonate.

16. A positive photosensitive resin composition according to claim 13, wherein the weight ratio of the photosensitizer (B1) and the photosensitizer (B2) is $0.1 \leq (B2)/(B1) \leq 0.5$.

17. A positive photosensitive resin composition according to claim 13, wherein the X of the polyamide resin represented by the general formula (1) is selected from a group of the formulas (6)

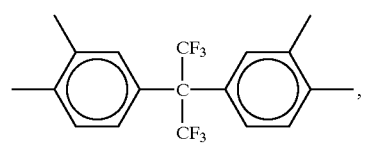

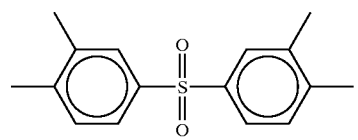

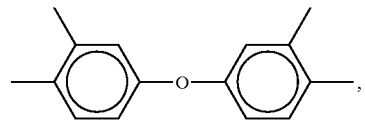

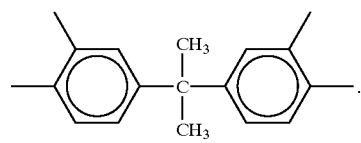

(6)

18. A positive photosensitive resin composition according to claim 13, wherein Y of the polyamide resin represented by the general formula (1) is selected from a group of the formulas (7)

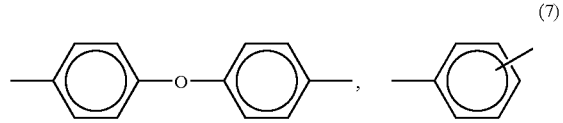

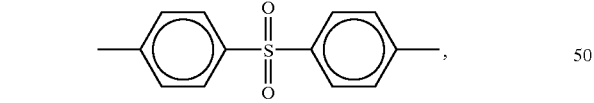

(7)

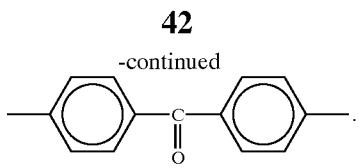

-continued

19. A positive photosensitive resin composition according to claim 13, wherein the E of the polyamide resin represented by the general formula (1) is selected from a group of the formulas (8)

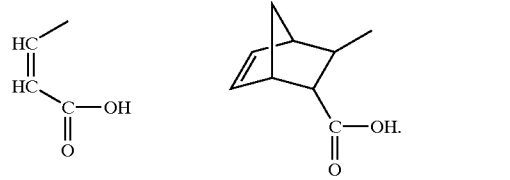

(8)

20. A positive photosensitive resin composition according to claim 13, wherein the phenol compound (C) is a phenol compound represented by the formula (9)

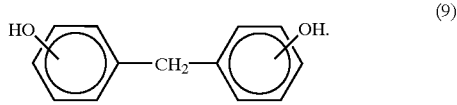

(9)

21. A positive photosensitive resin composition according to claim 13, wherein the total phenol compounds contain a phenol compound represented by the formula (10) and/or a phenol compound represented by the formula (11) in an amount of 50% by weight or more

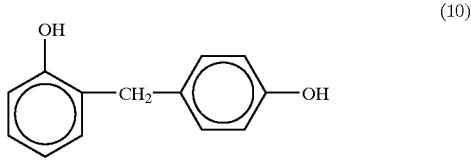

(10)

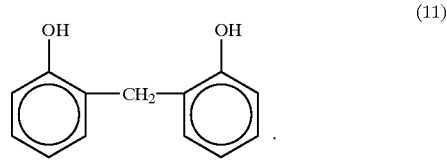

(11)

* * * * *

UNITED STATES PATENT AND TRADEMARK OFFICE
CERTIFICATE OF CORRECTION

PATENT NO. : 6,607,865 B2
DATED : August 19, 2003
INVENTOR(S) : Hiroaki Makabe et al.

It is certified that error appears in the above-identified patent and that said Letters Patent is hereby corrected as shown below:

<u>Title page,</u>
Item [73], Assignee, please delete "Sumitomo Electric Industries, Ltd., Osaka (JP)" and insert therefor -- Sumitomo Bakelite Company, Ltd., Tokyo (JP) --.

Signed and Sealed this

Fifteenth Day of March, 2005

JON W. DUDAS
*Director of the United States Patent and Trademark Office*